United States Patent
Wang et al.

(10) Patent No.: US 12,392,834 B2
(45) Date of Patent: Aug. 19, 2025

(54) STATE OF CHARGE SENSING FOR A MIXED CHEMISTRY BATTERY

(71) Applicant: GM GLOBAL TECHNOLOGY OPERATIONS LLC, Detroit, MI (US)

(72) Inventors: Yue-Yun Wang, Troy, MI (US); Junfeng Zhao, Troy, MI (US)

(73) Assignee: GM GLOBAL TECHNOLOGY OPERATIONS LLC, Detroit, MI (US)

(*) Notice: Subject to any disclaimer, the term of this patent is extended or adjusted under 35 U.S.C. 154(b) by 634 days.

(21) Appl. No.: 17/743,524

(22) Filed: May 13, 2022

(65) Prior Publication Data

US 2023/0366943 A1 Nov. 16, 2023

(51) Int. Cl.
| | |
|---|---|
| G01R 31/3842 | (2019.01) |
| G01R 31/36 | (2020.01) |
| H01M 10/0525 | (2010.01) |
| H01M 10/054 | (2010.01) |
| H01M 10/42 | (2006.01) |

(52) U.S. Cl.
CPC ..... *G01R 31/3842* (2019.01); *G01R 31/3648* (2013.01); *H01M 10/0525* (2013.01); *H01M 10/054* (2013.01); *H01M 10/4257* (2013.01)

(58) Field of Classification Search
CPC ............ G01R 31/3842; G01R 31/3648; G01R 31/382; G01R 31/367; G01R 31/387; H01M 10/0525; H01M 10/054; H01M 10/4257; H01M 2220/20; Y02E 60/10
See application file for complete search history.

(56) References Cited

U.S. PATENT DOCUMENTS

| | | | | |
|---|---|---|---|---|
| 10,118,500 B2* | 11/2018 | Lee | ................ | H01M 10/44 |
| 11,231,466 B2* | 1/2022 | Lim | ................ | G01R 31/367 |
| 11,422,199 B1* | 8/2022 | Xu | ................ | G01R 31/392 |
| 2012/0310568 A1* | 12/2012 | Wang | ................ | G01R 31/3842 |
| | | | | 702/63 |
| 2014/0227568 A1* | 8/2014 | Hermann | ................ | H01M 10/6571 |
| | | | | 429/62 |

(Continued)

FOREIGN PATENT DOCUMENTS

| | | | | |
|---|---|---|---|---|
| CN | 103969589 A | * | 8/2014 | ........... G01R 31/367 |
| DE | 102018206353 B3 | * | 3/2019 | ........... H01M 10/482 |
| WO | WO-2021086683 A1 | * | 5/2021 | ........... H01M 10/0525 |

OTHER PUBLICATIONS

Fathoni et al. "Comparison of State-of-Charge (SOC) Estimation Performance Based on three Popular Methods: Coulomb Counting, Open Circuit Voltage, and Kalman Filter" (Year: 2017).*

(Continued)

*Primary Examiner* — Eyob Hagos
(74) *Attorney, Agent, or Firm* — CANTOR COLBURN LLP

(57) ABSTRACT

A mixed chemistry battery including a sensing cell having a first chemistry, a battery cell having a second chemistry that is different than the first chemistry, where the battery cell is connected to the sensing cell in series. The mixed chemistry battery also includes a battery monitoring system configured to monitor a current flow through the sensing cell and the battery cell and to calculate a state-of-charge (SOC) of the sensing cell. The battery monitoring system is further configured to calculate a SOC of the battery cell based at least in part on the SOC of the sensing cell.

16 Claims, 6 Drawing Sheets

(56) References Cited

U.S. PATENT DOCUMENTS

| | | | |
|---|---|---|---|
| 2017/0153292 A1* | 6/2017 | Steiber | G01R 31/3648 |
| 2017/0253140 A1* | 9/2017 | Chang | H02J 7/16 |
| 2021/0135173 A1* | 5/2021 | Tokuoka | H01M 10/0525 |
| 2022/0131392 A1* | 4/2022 | Isa | G01R 31/367 |
| 2022/0221515 A1* | 7/2022 | Cai | H02J 7/0048 |

OTHER PUBLICATIONS

Wang1 et al "State of charge estimation for LiFePO4 battery via dual extended kalman filter and charging voltage curve" 2018 (Year: 2018).*

George et al. "State-of-Charge Estimation for Li—ion Batteries: A More Accurate Hybrid Approach", 2018 (Year: 2018).*

Li et al. "A study on the impact of open circuit voltage tests on state of charge estimation for lithium-ion batteries" 2017 (Year: 2017).*

Murnane et al. "A Closer Look at State of Charge (SOC) and State of Health (SOH) Estimation Techniques for Batteries", 2017 (Year: 2017).*

Tran et al "Comparative Study of Equivalent Circuit Models Performance in Four Common Lithium-Ion Batteries: LFP, NMC, LMO, NCA", 2017 (Year: 2017).*

Xiong et al. "Critical Review on the Battery State of Charge Estimation Methods for Electric Vehicles", 2017 (Year: 2017).*

Xu et al. "Adaptive State-of-Charge Estimation for Lithium-Ion Batteries by Considering Capacity Degradation", 2021 (Year: 2021).*

\* cited by examiner

STATE OF CHARGE SENSING FOR A MIXED CHEMISTRY BATTERY

INTRODUCTION

The disclosure relates to mixed chemistry batteries. More specifically, the disclosure relates to determining the state of charge of a mixed chemistry battery.

Lithium-ion batteries are used in a variety of applications, from electric vehicles to residential batteries to grid-scale applications. In general, the term lithium-ion battery refers to a wide array of battery chemistries that each charge and discharge using reactions from a lithiated metal oxide cathode and a graphite anode. As used herein, a mixed chemistry battery is a lithium-ion battery that includes battery cells that have at least two different chemistries. Two of the more commonly used lithium-ion chemistries are nickel manganese cobalt (NCM) and lithium iron phosphate (LFP). In general, LFP batteries are less expensive to manufacture than NCM batteries and NCM batteries have higher power rating and energy density compared to LFP batteries.

NCM battery's state of charge (SOC) varies distinctly by its open-circuit voltage (OCV) level. On the other hand, the LFP battery's SOC level cannot be easily determined based on its OCV due to its flat charge-discharge curve. As a result, accurate SOC diagnosis is possible for NCM batteries while the SOC accuracy for LFP batteries is very challenging.

SUMMARY

In one exemplary embodiment, a mixed chemistry battery is provided. The mixed chemistry battery includes a sensing cell having a first chemistry, a battery cell having a second chemistry that is different than the first chemistry, wherein the battery cell is connected to the sensing cell in series, and a battery monitoring system configured to monitor a current flow through the sensing cell and the battery cell and to calculate a state-of-charge (SOC) of the sensing cell. The battery monitoring system is further configured to calculate a SOC of the battery cell based at least in part on the SOC of the sensing cell.

In addition to the one or more features described herein the first chemistry is nickel-manganese cobalt and the second chemistry is lithium iron phosphate.

In addition to the one or more features described herein the SOC of the sensing cell is calculated using a combination of coulomb counting method and a Kalman filter method, and an open-circuit voltage (OCV) inverse lookup method.

In addition to the one or more features described herein the SOC of the battery cell is calculated by subtracting a minimum offset value from and adding a scaling value to the SOC of the sensing cell.

In addition to the one or more features described herein the SOC of the battery cell is calculated from the SOC of the sensing cell based on a linear relationship where a slope of a line is determined by a capacity ratio of the battery cell and the sensing cell, and an intercept is determined based on the capacity ratio multiplied by the minimum offset value.

In addition to the one or more features described herein the minimum offset value is determined based on a minimum accurate sensing SOC level of the sensing cell.

In addition to the one or more features described herein a capacity of the battery cell is equal to the capacity of the sensing cell multiplied by a scaling factor, which has a value of less than one.

In addition to the one or more features described herein the scaling factor is calculated by subtracting a minimum offset value and a maximum offset value from one, wherein the minimum offset value is determined based on a minimum accurate sensing SOC level of the sensing cell.

In addition to the one or more features described herein the battery monitoring system is further configured to measure an open circuit voltage of the sensing cell and the battery cell during a commanded rest of a vehicle containing the mixed chemistry battery based on a determination that the SOC of the sensing cell is one of below a minimum threshold value and above a maximum threshold value.

In addition to the one or more features described herein the battery monitoring system is further configured to calculate the SOC of the sensing cell based on the open circuit voltage of the sensing cell and to calculate the SOC of the battery cell based on the open circuit voltage of the battery cell.

In addition to the one or more features described herein the battery monitoring system is configured to calculate a degradation factor for at least one of the battery cell and the sensing cell based on a change in a capacity of the at least one of the battery cell and the sensing cell based on a determination that the SOC of the sensing cell is above a maximum threshold value.

In another exemplary embodiment, a method for determining a state-of-charge (SOC) of a battery cell of a mixed chemistry battery is provided. The method includes calculating a SOC of a sensing cell connected to the battery cell in series, wherein the sensing cell has a first chemistry and the battery cell has a second chemistry that is different than the first chemistry. The method also includes calculating an SOC of battery cell by subtracting a minimum offset value from and adding a scaling value to the SOC of the sensing cell. The minimum offset value is determined based on a minimum accurate sensing SOC level of the sensing cell.

In addition to the one or more features described herein the first chemistry is nickel-manganese cobalt and the second chemistry is lithium iron phosphate.

In addition to the one or more features described herein the SOC of the sensing cell is calculated using a combination of coulomb counting method and a Kalman filter method, and an open-circuit voltage (OCV) inverse lookup method.

In addition to the one or more features described herein a capacity of the battery cell is equal to the capacity of the sensing cell multiplied by a scaling factor, which has a value of less than one.

In addition to the one or more features described herein the scaling factor is calculated by subtracting a minimum offset value and a maximum offset value from one, wherein the minimum offset value is determined based on a minimum accurate sensing SOC level of the sensing cell.

In addition to the one or more features described herein the method further includes measuring an open circuit voltage of the sensing cell and the battery cell based on a determination that the SOC of the sensing cell is one of below a minimum threshold value and above a maximum threshold value.

In addition to the one or more features described herein the method further includes calculating the SOC of the sensing cell based on the open circuit voltage of the sensing cell and to calculating the SOC of the battery cell based on the open circuit voltage of the battery cell.

In addition to the one or more features described herein the method further includes calculating a degradation factor for at least one of the battery cell and the sensing cell based on a change in a capacity of the at least one of the battery cell and the sensing cell based on a determination that the SOC of the sensing cell is above a maximum threshold value In another exemplary embodiment, a computer program product for determining a state-of-charge (SOC) of a battery cell of a mixed chemistry battery is provided. The computer program product includes a computer readable storage medium having program instructions embodied therewith, the program instructions executable by a processor to cause the processor to perform operations. The operations include calculating a state-of-charge (SOC) of a sensing cell connected to a battery cell in series, wherein the sensing cell has a first chemistry and the battery cell has a second chemistry that is different than the first chemistry. The operations further include calculating an SOC of the battery cell by subtracting a minimum offset value from and adding a scaling value to the SOC of the sensing cell. The minimum offset value is determined based on a minimum accurate sensing SOC level of the sensing cell.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

Figure 1:
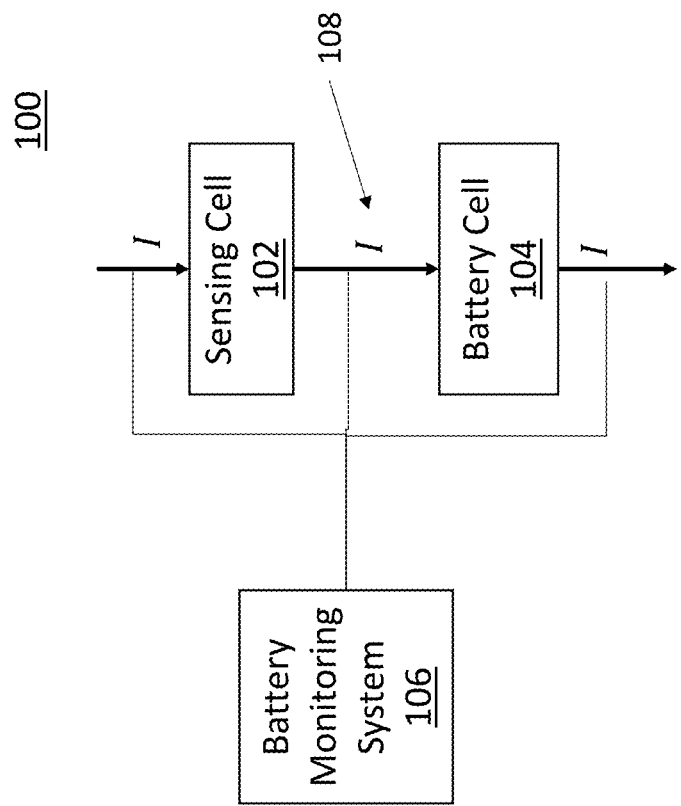
FIG. 1 is a block diagram illustrating a portion of a mixed chemistry battery in accordance with an exemplary embodiment.

The following description is merely exemplary in nature and is not intended to limit the present disclosure, its application or uses. Various embodiments of the disclosure are described herein with reference to the related drawings. Alternative embodiments of the disclosure can be devised without departing from the scope of the claims. Various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship.

Turning now to an overview of the aspects of the disclosure, embodiments of the disclosure include a mixed chemistry battery having a sensing cell and a battery cell connected in series. The sensing cell is a lithium-ion cell that includes a first chemistry that has a state-of-charge (SOC) that varies distinctly by its open-circuit voltage (OCV) level, such as nickel manganese cobalt (NCM), nickel cobalt aluminum (NCA), lithium-ion manganese (LMO), lithium cobalt (LCO), or the like. The battery cell is a lithium-ion cell that includes a second chemistry that has a SOC that does not vary distinctly by its OCV level, such as lithium iron phosphate (LFP), lithium iron manganese phosphate (LFMP), sodium ion, or the like. As discussed above, while an NCM battery's SOC varies distinctly by its OCV, an LFP battery's SOC level cannot be easily distinguished by its OCV due to its flat charge-discharge curve. Accordingly, in exemplary embodiments, the SOC of the sensing cell is used to determine the SOC of the battery cell.

Referring now to FIG. 1 a portion of a mixed chemistry battery 100 in accordance with an exemplary embodiment is shown. As illustrated, the mixed chemistry battery 100 includes a sensing cell 102 that is connected in series with a battery cell 104. In exemplary embodiments, the sensing cell 102 is one of several battery modules in series connection, each of which consists of a number of cells in the same chemistry, and the battery cell 104 is one of several battery modules in series connection, each of which consists of a number of cells in another chemistry. The mixed chemistry battery 100 also includes a battery monitoring system 106 that is configured to measure an open circuit-voltage (OCV) of both the sensing cell 102 and the battery cell 104 as well as the current I 108 that flows through the sensing cell 102 and the battery cell 104 and perform other SOC estimation related functions.

In exemplary embodiments, the battery monitoring system 106 includes one or more of a general processor, a central processing unit, an application-specific integrated circuit (ASIC), a digital signal processor, a field-programmable gate array (FPGA), a digital circuit, an analog circuit, or combinations thereof. In one embodiment, the battery monitoring system 106 also includes a memory in communication with the processor and other components of the battery monitoring system 106. In exemplary embodiments, the battery monitoring system 106 is configured to calculate and track the SOC and SOH of both the sensing cell 102 and the battery cell 104.

Figure 2:
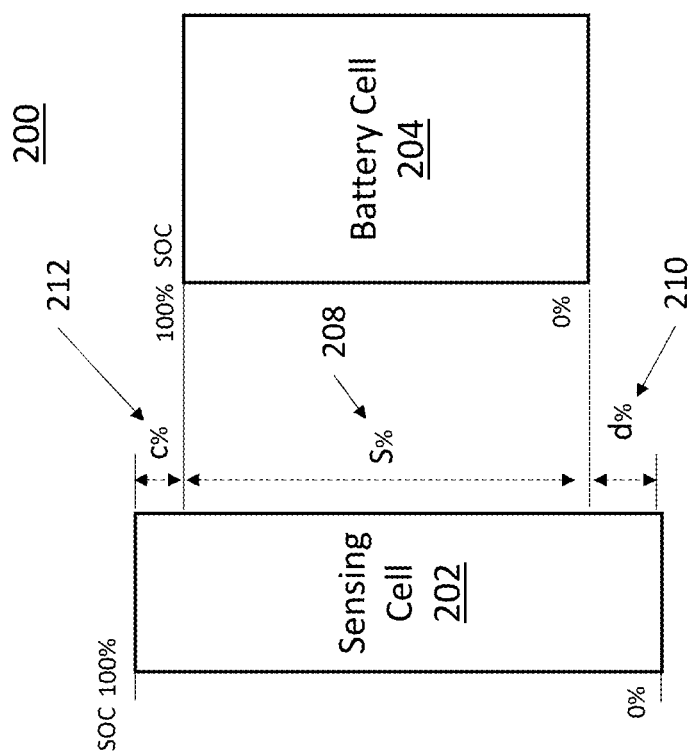
FIG. 2 is a block diagram illustrating a sensing cell and a battery cell of a mixed chemistry battery in accordance with an exemplary embodiment.

Referring now to FIG. 2 a block diagram illustrating a sensing cell 202 and a battery cell 204 of a mixed chemistry battery 200 in accordance with an exemplary embodiment is shown. In exemplary embodiments, the design of the battery cell 204 and the sensing cell 202 are configured such that the capacity of the sensing cell ($CAP_{SC}$) is greater than the capacity of the battery cell ($CAP_{BC}$). In exemplary embodiments, the capacity of the battery cell is equal to the portion or percentage of the capacity of the sensing cell multiplied by a scaling factor (S %) 208, which has a value of less than one. In one embodiment, the capacity of a new fully charged battery cell is configured to be eighty-five percent of the capacity of a new fully charged sensing cell, (i.e., the scaling factor is 0.85 or 85%).

In exemplary embodiments, the scaling factor (S) 208 is calculated by subtracting a minimum offset value (d) 210 and a maximum offset value (c) 212 from 1, (i.e., S+d+c=1). In exemplary embodiments, the minimum offset value (d) 210 is determined based on a minimum accurate sensing SOC level of the sensing cell. In exemplary embodiments, the maximum offset value (c) 212 is selected to protect the sensing cell 202 from being overcharged during charging of the mixed chemistry battery 200. In one embodiment, the maximum offset value (c) 212 is five percent.

Figure 3:
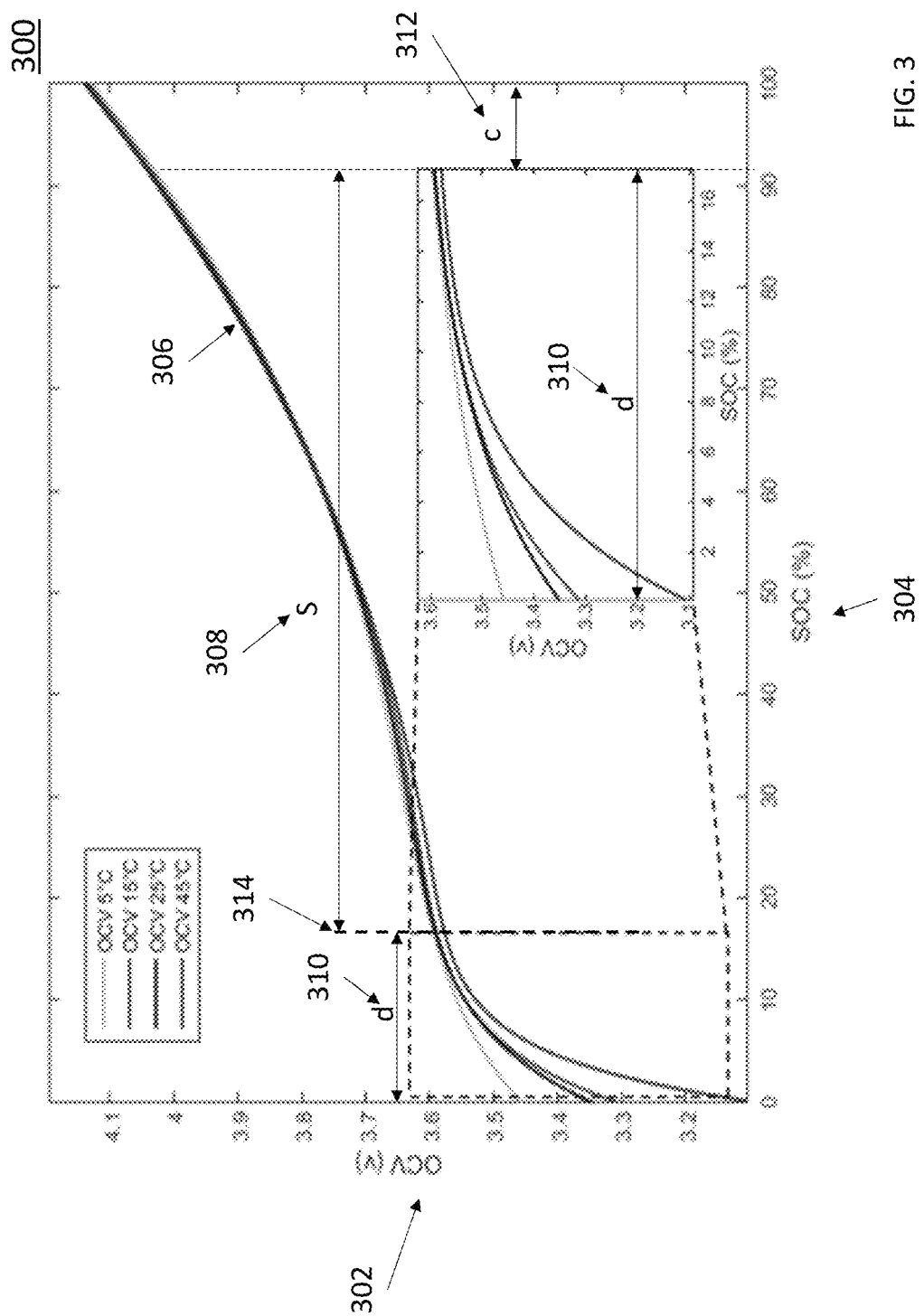
FIG. 3 is a graph illustrating a state of charge as a function of an open-circuit voltage and temperature of a sensing cell in accordance with an exemplary embodiment.

Referring now to FIG. 3, a graph 300 illustrating a state of charge 304 as a function of an open-circuit voltage 302 and temperature of a sensing cell in accordance with an exemplary embodiment is shown. The graph includes four SOC curves 306 for the sensing cell at different operating temperatures. As illustrated, below a cutoff value 314, the four SOC curves 306 generally diverge, however, above the cutoff value 314 the four SOC curves 306 generally overlap. In exemplary embodiments, the minimum offset value (d) 310 is determined based on the cutoff value 314. The scaling value (S) 308 is determined to be one minus the minimum offset value (d) 310 and the maximum offset value (c) 312. In one embodiment, as illustrated in FIG. 3, the maximum offset value (c) 212 is ten percent and the minimum offset value (d) 210 is seventeen percent. In another embodiment, as illustrated in FIG. 2, the maximum offset value (c) 212 is five percent and the minimum offset value (d) 210 is ten percent.

Figure 4:
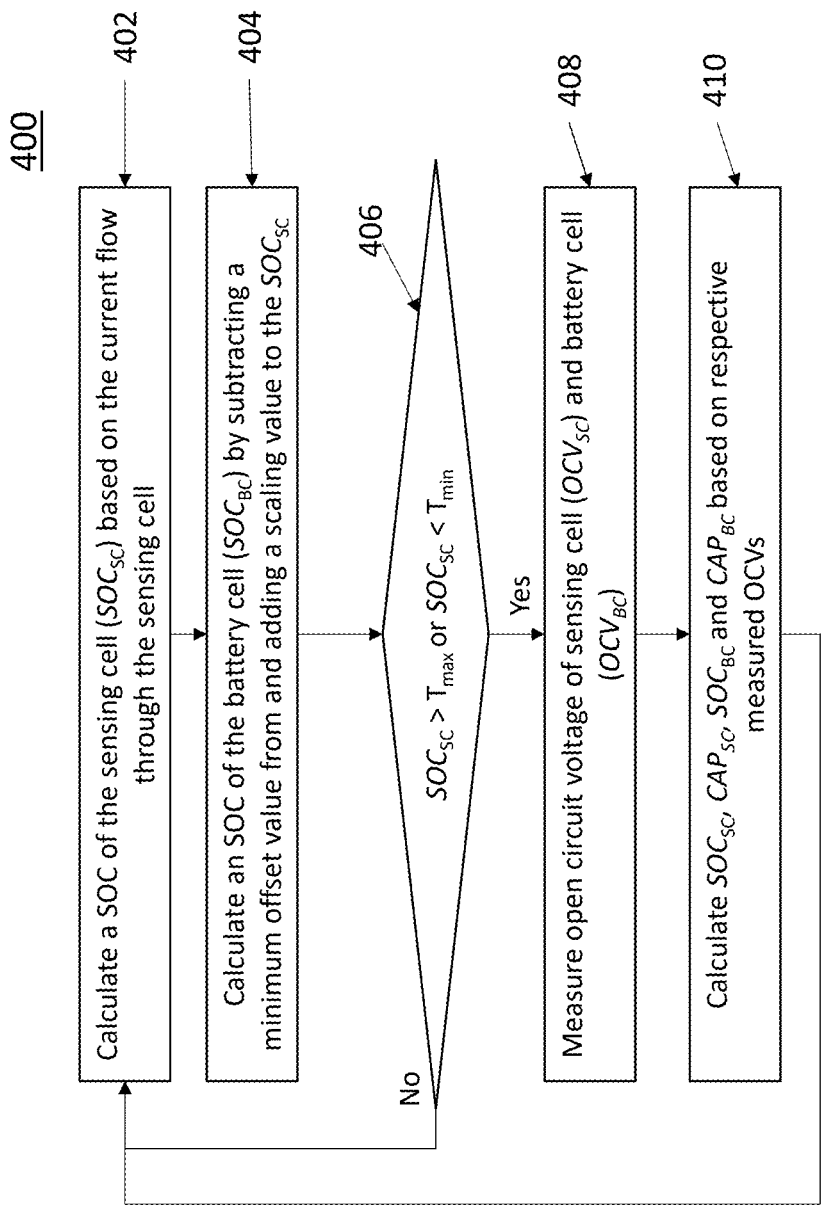
FIG. 4 is a flowchart illustrating a method for determining a state of charge of a battery cell in a mixed chemistry battery in accordance with an exemplary embodiment.

Referring now to FIG. 4, a flowchart illustrating a method 400 determining a state of charge of a battery cell in a mixed chemistry battery in accordance with an exemplary embodiment is shown. In exemplary embodiments, the method 400 is performed by a battery management system, such as the one shown in FIG. 1. As shown at block 402, the method 400 includes calculating a SOC of the sensing cell ($SOC_{SC}$) based on the current flow through the sensing cell. In exemplary embodiments, the SOC of the sensing cell ($SOC_{SC}$) is calculated based on a combination of Coulomb counting techniques and battery state estimation techniques, such as the use of a Kalman filter. Coulomb counting includes $SOC_{SC}(k) = SOC_{SC}(k-1) +$ $$\frac{\int i\, dt}{Cap},$$

where Cap is the capacity of the sensing cell, i is the current flow through the sensing cell, and k is integer that is incrementally increased each time $SOC_{SC}$ is calculated. In exemplary embodiment, a battery state estimation technique includes calculating $SOC = a(SOC_1 + (1-a)*SOC_2)$, where a is a weighting factor that is less than one. SOC' represents the state of charge calculated from Coulomb counting, $SOC_2$ represents the state of charge estimated using Kalman filter. In exemplary embodiments, whenever an electric vehicle that includes the mixed chemistry battery is at rest for a sufficient amount of time, the calculated sensing cell SOC is reset to a more accurate value based on OCV-SOC curve in FIG. 3 and the accurately measured OCV of the sensing cell.

Next, as shown at block 404, the method 400 includes calculating an SOC of the battery cell ($SOC_{BC}$) by subtracting a minimum offset value from and adding a scaling value to the $SOC_{SC}$. In exemplary embodiments, the estimated $SOC_{SC}$ is calculated using the following equation:

$$SOC_{BC} = SOC_{SC} - d + \left(1 - \frac{S\%}{100\%}\right)\frac{\int i\, dt}{CAP_{BC}},$$

where d is the minimum offset value and $$\left(1 - \frac{S\%}{100\%}\right)\frac{\int i\, dt}{CAP_{BC}}$$

is the scaling value. The scaling value is calculated based on the scaling factor (S), the capacity of the battery cell ($CAP_{BC}$) and the current through the battery cell (i).

Next, as shown at decision block 406, the method 400 includes determining if $SOC_{SC}$ is greater than a maximum threshold ($T_{max}$) or less than a minimum threshold ($T_{min}$), (i.e., is the sensing cell close to fully charged or close to completely depleted). In exemplary embodiments, $T_{min}$ is selected to be an SOC level that is equal to or less than the minimum offset value (d) and $T_{max}$ is selected to be an SOC level that is equal to or less than one hundred minus the maximum offset value (c). If the $SOC_{SC}$ is between $T_{min}$ and $T_{max}$, the method 400 returns to block 402 and periodically recalculates the $SOC_{SC}$. then calculate $SOC_{BC}$ at 404. Otherwise, the method 400 proceeds to block 408, and measures an open circuit voltage of sensing cell ($OCV_{SC}$) and battery cell ($OCV_{BC}$) when the vehicle containing the battery is at rest. In exemplary embodiments, the OCVs are measured when the current flow through the sensing cell and battery cell is zero, i.e., (when the sensing cell and battery cell are not being charged or depleted).

Continuing with reference to FIG. 4, as shown at block 410, the method 400 includes calculating $SOC_{SC}$, $CAP_{SC}$, $SOC_{BC}$ and $CAP_{BC}$ based on respective measured OCVs. In exemplary embodiments, once the $SOC_{SC}$, $CAP_{SC}$, $SOC_{BC}$ and $CAP_{BC}$ are calculated, degradation factors in cell capacity are calculated for both the battery cell and the sensing cell. These degradation factors are used in subsequent calculations of the $SOC_{SC}$ and $SOC_{BC}$.

Figure 5:
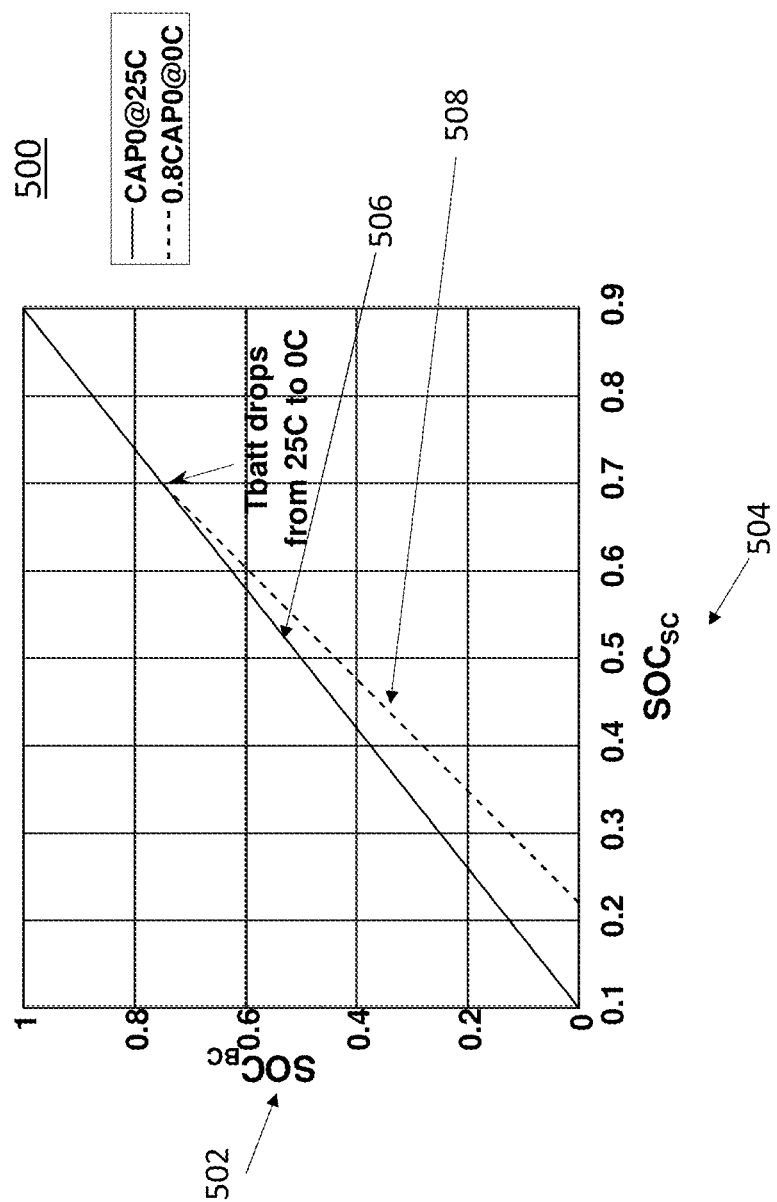
FIG. 5 is a graph illustrating an impact on the calculation of the state of charge of the battery cell based on the degradation of the capacity of the battery cell in accordance with an exemplary embodiment.

Referring now to FIG. 5, a graph 500 illustrating an impact on the calculation of the state of charge of the battery cell ($SOC_{BC}$) 502 based on the degradation of the capacity of the battery cell in accordance with an exemplary embodiment is shown. The graph 500 includes two curves 506, 508 that illustrate the relationships between the $SOC_{SC}$ 504 and $SOC_{BC}$ 502 at different temperatures. As shown, as the temperature decreases, the battery cell experiences up to a twenty-percent capacity loss. The following equation is used to calculate the state of charge of battery cell $SOC_{BC}$ based on α, which is a battery cell capacity degradation factor that has a value of less than one:

$$SOC_{BC1} = \frac{CAP_{SC}}{\alpha \times CAP_{BC}} SOC_{SC1} + \left(SOC_{BC0} - \frac{CAP_{SC}}{\alpha \times CAP_{BC}} SOC_{SC0}\right),$$

$$CAP_{BC} = f(T),$$

where T is the temperature of the battery cell. The battery cell capacity is dropped from $CAP_{BC}$ to $\alpha CAP_{BC}$. Based on previously calculated $SOC_{SC0}$ and referred battery cell $SOC_{BC0}$, and the current $SOC_{SC1}$, one can estimate the battery cell $SOC_{BC1}$ at the current time from the above equation. This estimation follows the new curve 508 where for any given $SOC_{SC}$, one can calculate $SOC_{BC}$ from the new line 508, and the slope of line 508 is larger than 506 because of the ratio ($CAP_{SC}/\alpha CAP_{BC}$).

Figure 6:
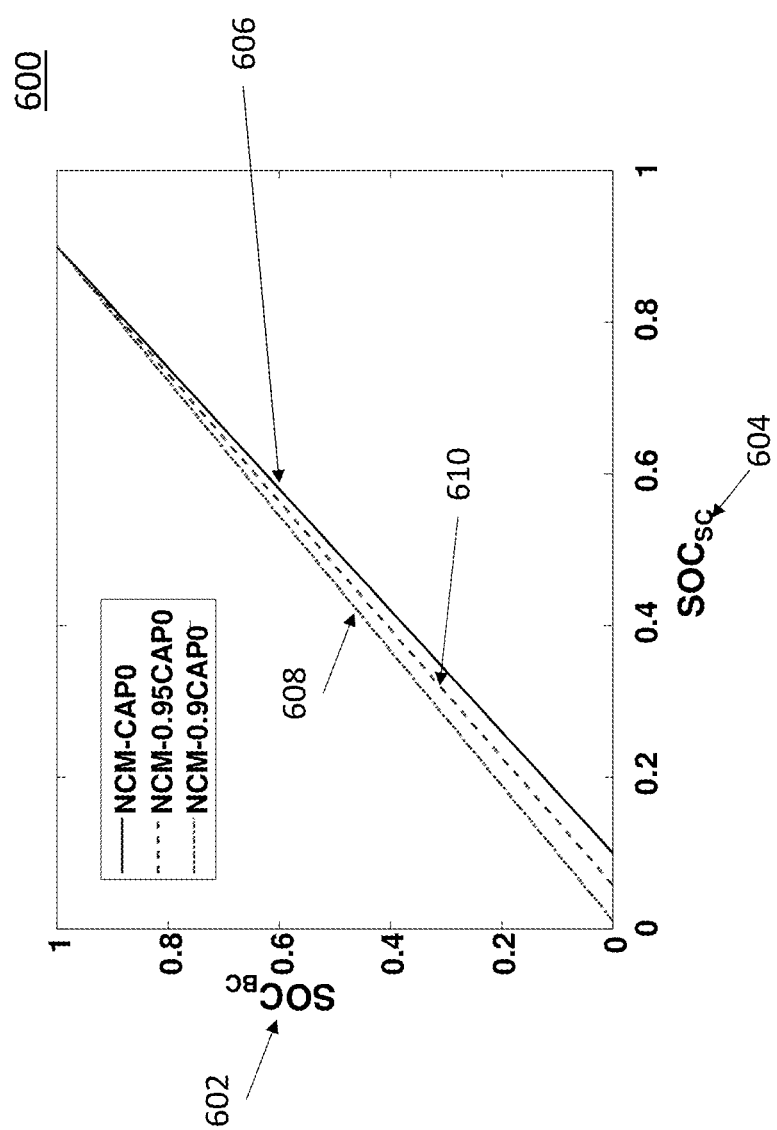
FIG. 6 is a graph illustrating an impact on the calculation of the state of charge of the battery cell based on the degradation of the capacity of the sensing cell in accordance with an exemplary embodiment.

Referring now to FIG. 6, a graph 600 illustrating an impact on the calculation of the state of charge of the battery cell ($SOC_{BC}$) 602 based on the degradation of the capacity of the sensing cell ($SOC_{SC}$) 604 in accordance with an exemplary embodiment is shown. The graph 600 includes three curves 606, 608, and 610 that illustrate the relationships between the $SOC_{SC}$ and $SOC_{BC}$ at as the capacity of the sensing cell decreases. As shown, curve 606 shows the relationship between the nominal $SOC_{BC}$ and $SOC_{SC}$, when the SC has 100% of its original capacity, curve 610 shows the relationship between the $SOC_{BC}$ and $SOC_{SC}$, when the SC has 95% of its original capacity, and curve 608 shows the relationship between the $SOC_{BC}$ and $SOC_{SC}$, when the SC has 90% of its original capacity. The following equation is used to calculate the state of charge of the battery cell based on the coefficient β, which is a sensing cell capacity degradation factor that has a value of less than one:

$$SOC_{BC1} = \frac{\beta \times CAP_{SC}}{CAP_{BC}} SOC_{SC1} + \left(SOC_{BC0} - \frac{\beta \times CAP_{SC}}{CAP_{BC}} SOC_{SC0}\right).$$

where based on previously calculated $SOC_{SC0}$ and referred battery cell $SOC_{BC0}$, and the current $SOC_{SC1}$, one can estimate the battery cell $SOC_{BC1}$ at the current time from the above equation.

In exemplary embodiments, the sensing cell degradation factor (β) and the battery cell degradation factor (α) are calculated periodically when the battery cell and sensing cell are at rest based on the measured open circuit values for the battery cell and sensing cell. The sensing cell degradation factor (β) and the battery cell degradation factor (α) are used during the calculation of $SOC_{SC}$ and $SOC_{SC}$ during use of the mixed chemistry battery.

The graphs illustrated in FIG. 5 and FIG. 6 illustrate sensing cells and battery cells with nominal capacities. In the event that the previous calculated SOC starts at fully depleted battery cell $SOC_{BC0}=0$ and $SOC_{SC0}=d$ %, the equation becomes:

$$SOC_{BC1} = \frac{CAP_{SC}}{CAP_{BC}} SOC_{SC1} - \frac{CAP_{SC}}{CAP_{BC}} d \%,$$

which is a straight-line with a slope of $CAP_{SC}/CAP_{BC}$ and an intercept of $CAP_{SC}/CAP_{BC}*d$. Accordingly, for any given $SOC_{SC1}$, linear interpolation can be used to calculate $SOC_{BC1}$.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, (i.e., one, two, three, four, etc.). The terms "a plurality" may be understood to include any integer number greater than or equal to two, (i.e., two, three, four, five, etc.). The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A mixed chemistry battery comprising:
a sensing cell having a first chemistry, wherein the first chemistry has a state-of-charge (SOC) that varies distinctly by an open-circuit voltage (OCV) level of the sensing cell;
a battery cell having a second chemistry that is different than the first chemistry, the second chemistry has a SOC that does not vary distinctly by an OCV level of the battery cell, wherein the battery cell is connected to the sensing cell in series; and
a battery monitoring system configured to monitor a current flow through the sensing cell and the battery cell and to calculate a state-of-charge (SOC) of the sensing cell based on a current flows through the sensing cell, the battery monitoring system including at least one sensor configured to measure an open circuit voltage (OCV) of the sensing cell, an OCV of the battery cell and a current flowing through the sensing cell and the battery cell,
wherein the battery monitoring system is further configured to calculate a SOC of the battery cell based at least in part on the SOC of the sensing cell, the calculation being according to $$SOC_{BC} = SOC_{SC} - d + \left(1 - \frac{S\%}{100\%}\right)\frac{\int i dt}{CAP_{BC}},$$

where $SOC_{BC}$ is the SOC of the battery cell, $SOC_{SC}$ is the SOC of the sensing cell, d is the minimum offset value and $$\left(1 - \frac{S\%}{100\%}\right)\frac{\int i dt}{CAP_{BC}}$$

is the scaling value, with S being the scaling factor, $CAP_{BC}$ being the capacity of the battery cell and i the current through the battery cell;
the mixed chemistry battery being an electric vehicle battery, the battery monitoring system being a vehicle battery monitoring system, and wherein the battery monitoring system is configured to respond to the electric vehicle being at rest for at least a threshold amount of time by resetting the calculated SOC of the sensing cell based on a sensing cell SOC curve;
wherein the capacity of the battery cell is equal to the capacity of the sensing cell multiplied by the scaling factor, which has a value of less than one; and wherein the scaling factor is calculated by subtracting the minimum offset value and a maximum offset value from one, wherein the minimum offset value is determined based on a minimum SOC level at which accurate sensing may be provided by the sensing cell.

2. The mixed chemistry battery of claim 1, wherein the first chemistry is nickel-manganese cobalt and the second chemistry is lithium iron phosphate.

3. The mixed chemistry battery of claim 1, wherein the SOC of the sensing cell is calculated using a combination of coulomb counting method and a Kalman filter method, and an open-circuit voltage (OCV) inverse lookup method.

4. The mixed chemistry battery of claim 1, wherein the minimum offset value is determined based on a minimum SOC level at which accurate sensing may be provided by the sensing cell.

5. The mixed chemistry battery of claim 1, wherein based on a determination that the SOC of the sensing cell is one of below a minimum threshold value and above a maximum threshold value, the battery monitoring system is further configured to measure an open circuit voltage of the sensing cell and the battery cell during a commanded rest of a vehicle containing the mixed chemistry battery.

6. The mixed chemistry battery of claim 5, wherein the battery monitoring system is further configured to calculate the SOC of the sensing cell based on the open circuit voltage of the sensing cell and to calculate the SOC of the battery cell based on the open circuit voltage of the battery cell.

7. The mixed chemistry battery of claim 1, wherein based on a determination that the SOC of the sensing cell is above a maximum threshold value, the battery monitoring system is configured to calculate a degradation factor for at least one of the battery cell and the sensing cell based on a change in a capacity of the at least one of the battery cell and the sensing cell.

8. The mixed chemistry battery of claim 1, wherein the battery monitoring system is further configured to calculate the SOC of the battery cell based at least in part on the SOC of the sensing cell while the battery cell is being utilized.

9. A method for determining a state-of-charge (SOC) of a battery cell of a mixed chemistry battery, the method comprising:
measuring an open circuit voltage (OCV) of a sensing cell, measuring an OCV of a battery cell, and measuring a current passing through the sensing cell and the battery cell using at least one sensor of a battery monitoring system;
calculating a SOC of the sensing cell connected to the battery cell in series, wherein the sensing cell has a first chemistry and the battery cell has a second chemistry that is different than the first chemistry; wherein the first chemistry has a state-of-charge (SOC) that varies distinctly by the open-circuit voltage (OCV) level of the sensing cell and the second chemistry has a SOC that does not vary distinctly by an OCV level of the battery cell; and
calculating an SOC of battery cell according to $$SOC_{BC} = SOC_{SC} - d + \left(1 - \frac{S\%}{100\%}\right)\frac{\int idt}{CAP_{BC}},$$

where $SOC_{BC}$ is the SOC of the battery cell, $SOC_{SC}$ is the SOC of the sensing cell, d is the minimum offset value and $$\left(1 - \frac{S\%}{100\%}\right)\frac{\int idt}{CAP_{BC}}$$

is the scaling value, with S being the scaling factor, $CAP_{BC}$ being the capacity of the battery cell and i the current through the battery cell,
the mixed chemistry battery being an electric vehicle battery, the battery monitoring system being a vehicle battery monitoring system, and wherein the battery monitoring system is configured to respond to the electric vehicle being at rest for at least a threshold amount of time by resetting the calculated SOC of the sensing cell based on a sensing cell SOC curve;
wherein the capacity of the battery cell is equal to the capacity of the sensing cell multiplied by the scaling factor, which has a value of less than one; and
wherein the scaling factor is calculated by subtracting the minimum offset value and a maximum offset value from one, wherein the minimum offset value is determined based on a minimum SOC level at which accurate sensing may be provided by the sensing cell.

10. The method of claim 9, wherein the first chemistry is nickel-manganese cobalt and the second chemistry is lithium iron phosphate.

11. The method of claim 9, wherein the SOC of the sensing cell is calculated using a combination of coulomb counting method and a Kalman filter method, and an open-circuit voltage (OCV) inverse lookup method.

12. The method of claim 9, wherein based on a determination that the SOC of the sensing cell is one of below a minimum threshold value and above a maximum threshold value, the method further comprises measuring an open circuit voltage of the sensing cell and the battery cell.

13. The method of claim 12, further comprising calculating the SOC of the sensing cell based on the open circuit voltage of the sensing cell and to calculating the SOC of the battery cell based on the open circuit voltage of the battery cell.

14. The method of claim 9, wherein based on a determination that the SOC of the sensing cell is above a maximum threshold value, the method further comprises calculating a degradation factor for at least one of the battery cell and the sensing cell based on a change in a capacity of the at least one of the battery cell and the sensing cell.

15. A computer program product comprising a non-transitory computer readable storage medium having program instructions embodied therewith, the program instructions executable by a processor to cause the processor to perform operations comprising:
receiving, from a battery monitoring system, a measured open circuit voltage (OCV) of a sensing cell, an OCV of a battery cell and a current flowing through the sensing cell and the battery cell,
calculating a state-of-charge (SOC) of a sensing cell connected to a battery cell in series, wherein the sensing cell has a first chemistry and the battery cell has a second chemistry that is different than the first chemistry; wherein the first chemistry has a state-of-charge (SOC) that varies distinctly by the open-circuit voltage (OCV) level of the sensing cell and the second chemistry has a SOC that does not vary distinctly by an OCV level of the battery cell; and
calculating an SOC of the battery cell according to $$SOC_{BC} = SOC_{SC} - d + \left(1 - \frac{S\%}{100\%}\right)\frac{\int idt}{CAP_{BC}},$$

where $SOC_{BC}$ is the SOC of the battery cell, $SOC_{SC}$ is the SOC of the sensing cell, d is the minimum offset value and $$\left(1 - \frac{S\%}{100\%}\right)\frac{\int idt}{CAP_{BC}}$$

is the scaling value, with S being the scaling factor, $CAP_{BC}$ being the capacity of the battery cell and i the current through the battery cell;

the mixed chemistry battery being an electric vehicle batter, the battery monitoring system being a vehicle battery monitoring system, and wherein the battery monitoring system is configured to respond to the electric vehicle being at rest for at least a threshold amount of time by resetting the calculated SOC of the sensing cell based on a sensing cell SOC curve;

wherein the capacity of the battery cell is equal to the capacity of the sensing cell multiplied by the scaling factor, which has a value of less than one; and wherein the scaling factor is calculated by subtracting the minimum offset value and a maximum offset value from one, wherein the minimum offset value is determined based on a minimum SOC level at which accurate sensing may be provided by the sensing cell.

16. The method of claim 9 wherein calculating the SOC of battery cell occurs while the battery cell is being utilized.

* * * * *